(12) United States Patent
Matsuura (10) Patent No.: US 11,152,196 B2
(45) Date of Patent: Oct. 19, 2021

(54) SUBSTRATE PROCESSING APPARATUS (71) Applicant: TOKYO ELECTRON LIMITED, Tokyo (JP)

(72) Inventor: Shin Matsuura, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 469 days.

(21) Appl. No.: 15/413,521

(22) Filed: Jan. 24, 2017

(65) Prior Publication Data

US 2017/0213707 A1    Jul. 27, 2017

(30) Foreign Application Priority Data

Jan. 25, 2016 (JP) .............................. JP2016-011403

(51) Int. Cl.
*H01J 37/32* (2006.01)
*H01L 21/67* (2006.01)

(52) U.S. Cl.
CPC .. *H01J 37/32715* (2013.01); *H01J 37/32009* (2013.01); *H01J 37/32807* (2013.01); *H01J 37/32834* (2013.01); *H01J 37/32871* (2013.01); *H01L 21/67017* (2013.01); *H01L 21/6719* (2013.01); *H01L 21/67069* (2013.01); *H01J 2237/334* (2013.01)

(58) Field of Classification Search
CPC ........... H01J 37/32715; H01J 37/32009; H01J 37/32807; H01J 37/32834; H01J 37/32871; H01J 2237/334; H01J 37/32816–32844; H01L 21/67017; H01L 21/67069; H01L 21/6719; C23C 16/4412

USPC ..................................................... 156/345.51
See application file for complete search history.

(56) References Cited

U.S. PATENT DOCUMENTS

| | | | | |
|---|---|---|---|---|
| 4,929,139 A | * | 5/1990 | Vorreiter | ................... B08B 6/00 414/217 |
| 2001/0032591 A1 | * | 10/2001 | Carducci | ........... H01J 37/32834 118/723 E |
| 2003/0159779 A1 | * | 8/2003 | Sago | ................. H01L 21/67069 156/345.24 |
| 2004/0035530 A1 | * | 2/2004 | LIzuka | .................. C23C 16/455 156/345.29 |
| 2004/0040662 A1 | * | 3/2004 | Edamura | ........... H01J 37/32477 156/345.48 |
| 2008/0156266 A1 | * | 7/2008 | Yamamoto | ........ H01J 37/32559 118/723 R |
| 2008/0236752 A1 | * | 10/2008 | Honda | .............. H01J 37/32559 156/345.43 |

(Continued)

FOREIGN PATENT DOCUMENTS

| CN | 1934684 A | 3/2007 |
|---|---|---|
| CN | 102668026 A | 9/2012 |

(Continued)

*Primary Examiner* — Charlee J. C. Bennett
(74) *Attorney, Agent, or Firm* — Rothwell, Figg, Ernst & Manbeck, P.C.

(57) ABSTRACT

Provided is a substrate processing apparatus including a chamber; a placing table provided inside the chamber and configured to place a processing target substrate thereon; a pedestal configured to support the placing table from a lower side thereof; an exhaust port disposed below the pedestal; and a collecting member configured to collect a deposition in the chamber. The collecting member is provided on a lower surface of the pedestal.

12 Claims, 9 Drawing Sheets

(56) References Cited

U.S. PATENT DOCUMENTS

| | | | | |
|---|---|---|---|---|
| 2009/0217634 | A1* | 9/2009 | Choi | C23C 16/4412 |
| | | | | 55/426 |
| 2010/0012292 | A1* | 1/2010 | Yamazaki | H01L 21/67017 |
| | | | | 165/61 |
| 2010/0186672 | A1* | 7/2010 | Okuda | H01L 21/67109 |
| | | | | 118/723 R |
| 2012/0267546 | A1* | 10/2012 | Reynolds | H01J 37/3171 |
| | | | | 250/423 R |
| 2013/0087286 | A1* | 4/2013 | Carducci | H01J 37/32082 |
| | | | | 156/345.43 |

FOREIGN PATENT DOCUMENTS

| | | |
|---|---|---|
| JP | 2007-242777 A | 9/2007 |
| JP | 2011-3704 A | 1/2011 |
| JP | 2013-179054 A | 9/2013 |
| JP | 2015-141908 A | 8/2015 |

* cited by examiner

SUBSTRATE PROCESSING APPARATUS

CROSS-REFERENCE TO RELATED APPLICATIONS

This application is based on and claims priority from Japanese Patent Application No. 2016-011403 filed on Jan. 25, 2016, with the Japan Patent Office, the disclosure of which is incorporated herein in its entirety by reference.

TECHNICAL FIELD

Various aspects and embodiments of the present disclosure relate to a substrate processing apparatus.

BACKGROUND

In a process of manufacturing a semiconductor device, various processings, such as, for example, etching or film forming, are performed on a processing target substrate by a processing gas supplied into a chamber. The accuracy of the processing performed on the processing target substrate greatly depends on conditions such as, for example, the pressure or temperature in the chamber. In addition, even if, for example, the pressure or temperature in the chamber is constant, the accuracy of the processing on the surface of the processing target substrate becomes uneven when, for example, deviation occurs in, for example, the pressure or temperature on the surface of the processing target substrate.

To avoid this, a technique has been known in which exhaust ports are symmetrically arranged with respect to a processing target substrate in a chamber (see, e.g., Japanese Patent Laid-open Publication Nos. 2013-179054, 2011-003704, 2015-141908, and 2007-242777). Thus, the in-plane processing uniformity of the processing target substrate is improved.

SUMMARY

An aspect of the present disclosure is a substrate processing apparatus including a chamber, a placing table, a pedestal, an exhaust port, and a collecting member. The placing table is provided in the chamber and places a processing target substrate thereon. The pedestal supports the placing table from the lower side thereof. The exhaust port is disposed below the pedestal. The collecting member is provided on a lower surface of the pedestal and collects a deposit inside the chamber.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawings, which form a part hereof. The illustrative embodiments described in the detailed description, drawing, and claims are not meant to be limiting. Other embodiments may be utilized, and other changes may be made without departing from the spirit or scope of the subject matter presented here.

Particles of a reaction byproduct, called a deposit, are included in a processing gas exhausted from the inside of a chamber. Such a deposit is attached to the sidewall of an exhaust path or inside an exhaust pump, which is connected to the exhaust path, in an exhaust process. When the amount of the deposit attached to the exhaust pump is increased, the exhaust ability of the exhaust pump is deteriorated, which makes it difficult to maintain the inside of the chamber at a predetermined pressure. Therefore, in order to remove the deposit attached inside the exhaust pump, the exhaust pump needs to be regularly disassembled and washed. When washing of the exhaust pump is performed, the process remains stopped until the washing of the exhaust pump ends, which causes deterioration in the throughput of the process.

According to an aspect of the present disclosure, a substrate processing apparatus includes a chamber, a placing table, pedestal, and exhaust port, and a collecting member. The placing table is provided inside the chamber and places a processing target substrate thereon. The pedestal supports the placing table from a lower side thereof. The exhaust port is disposed below the pedestal. The collecting member collects a deposit in the chamber, and is provided on a lower surface of the pedestal.

According to an exemplary embodiment of the substrate processing apparatus, the chamber may have a substantially cylindrical inner sidewall, and the pedestal may be supported by a plurality of support beams that extends from the inner sidewall of the chamber in a direction approaching a center axis of the inner sidewall.

According to an exemplary embodiment of the substrate processing apparatus, the collecting member may be additionally placed on at least one of a side surface of the pedestal and an upper surface, a side surface and a lower surface of each of the support beams.

According to an exemplary embodiment of the substrate processing apparatus, the placing table may have a substantially cylindrical outer sidewall. In addition, the exhaust port may have a substantially cylindrical shape. In addition, the chamber, the placing table, and the exhaust port may be arranged such that a center axis of the processing target substrate placed on the placing table coincides with the center axis of the inner sidewall of the chamber, a center axis of the outer sidewall of the placing table, and a center axis of the exhaust port. In addition, the support beams may be arranged such that the center axis of the processing target substrate placed on the placing table passes through a center of arrangement of the plurality of support beams.

According to an exemplary embodiment of the substrate processing apparatus, the sidewall of the chamber below the pedestal may be provided with a window that is opened at the time of carry-in/out of the collecting member.

According to an exemplary embodiment of the substrate processing apparatus, the pedestal may be provided therein with a cooling device to cool the lower surface of the pedestal.

According to an exemplary embodiment of the substrate processing apparatus, the cooling device may cool the lower surface using any one of water, air and brine as a coolant.

According to an exemplary embodiment of the substrate processing apparatus, the collecting member may be additionally arranged at a position below a placement surface of the placing table, on the inner sidewall of the chamber and the outer sidewall of the placing table.

According to an exemplary embodiment of the substrate processing apparatus, the collecting member may have a surface roughness within a range from 6.3 μm to 25 μm.

According to an exemplary embodiment of the substrate processing apparatus, the collecting member may be formed of a metal.

According to various aspects and embodiments of the present disclosure, the throughput of a process may be improved.

Hereinafter, an exemplary embodiment of a disclosed substrate processing apparatus will be described in detail with reference to the accompanying drawings. The disclosed substrate processing apparatus is not limited by the present exemplary embodiment.

Exemplary Embodiment

[Configuration of Substrate Processing Apparatus 10]

Figure 1:
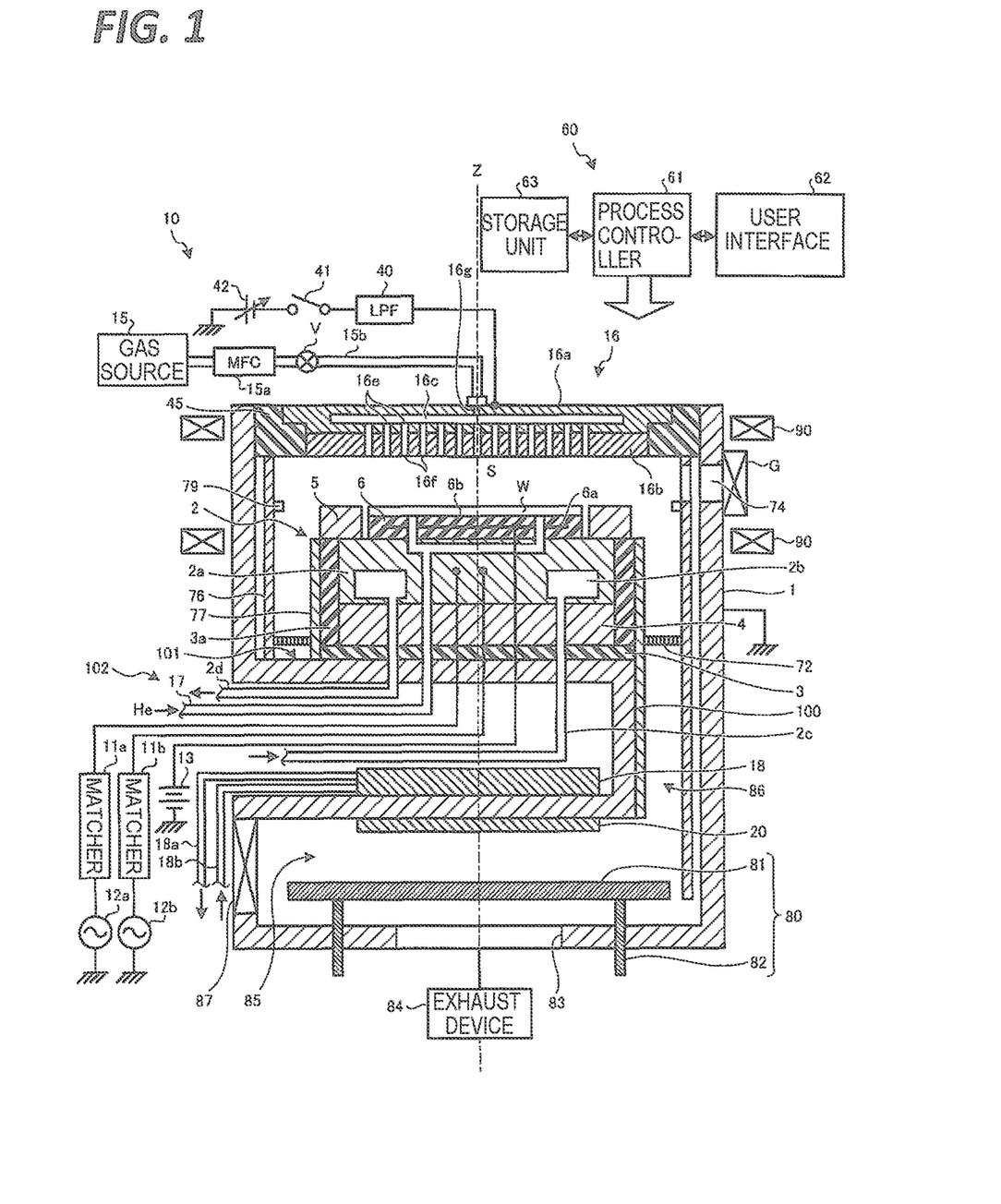
FIG. 1 is a cross-sectional view illustrating an example of a substrate processing apparatus.

FIG. 1 is a cross-sectional view illustrating an example of a substrate processing apparatus 10. The substrate processing apparatus 10 in the present exemplary embodiment is, for example, a capacitively coupled parallel plate plasma etching apparatus. The substrate processing apparatus 10 includes a chamber 1 which is formed of, for example, aluminum of which the surface is subjected to anodizing treatment. The chamber 1 has a substantially cylindrical a space defined therein. The chamber 1 is grounded for safety. The chamber 1 is arranged such that the center axis of the substantially cylindrical space, which is defined by the inner sidewall of the chamber 1, coincides with the Z-axis illustrated in FIG. 1.

A substantially cylindrical exhaust port 83 is formed in the bottom portion of the chamber 1. A pedestal 100 is provided above the exhaust port 83 to support a placing table 2 from the lower side thereof. The pedestal 100 is supported by a plurality of support beams 101, which extend from the inner sidewall of the chamber 1 in the direction approaching the Z-axis. In the present exemplary embodiment, each support beam 101 extends from the inner sidewall of the chamber 1 toward the Z-axis in the direction perpendicular to the Z-axis. In the present exemplary embodiment, the pedestal 100 and each support beam 101 are formed of the same material as the chamber 1.

In the present exemplary embodiment, the placing table 2 has a substantially cylindrical shape and is disposed inside the chamber 1 such that the center axis of the outer sidewall of the placing table 2 coincides with the Z-axis. The placing table 2 includes a lower electrode 2a, a base 4, a focus ring 5, and an electrostatic chuck 6. The base 4 is formed of, for example, ceramics in a substantially cylindrical shape, and is disposed over the pedestal 100 via an insulation plate 3. The lower electrode 2a, which is formed of, for example, aluminum, is provided over the base 4.

The electrostatic chuck 6 is provided on the upper surface of the lower electrode 2a to attract and hold a semiconductor wafer W, which is an example of a processing target substrate, by an electrostatic force. The electrostatic chuck 6 has a structure in which an electrode 6a, formed of a conductive film, is inserted between a pair of insulation layers or insulation sheets. A direct current (DC) power source 13 is electrically connected to the electrode 6a. The semiconductor wafer W is placed on an upper surface 6b of the electrostatic chuck 6, and is attracted to and held on the upper surface 6b of the electrostatic chuck 6 by an electrostatic force, which is generated in the electrostatic chuck 6 by a DC voltage supplied from the DC power source 13. The semiconductor wafer W has a substantially circular shape. The Z-axis illustrated in FIG. 1 represents the center axis of the semiconductor wafer W, which is attached to and held on the upper surface 6b of the electrostatic chuck 6. The upper surface 6b of the electrostatic chuck 6, on which the semiconductor wafer W is placed, is an example of a placement surface of the placing table 2.

The conductive focus ring 5, which is formed of, for example, monocrystalline silicon, is provided on the upper surface of the lower electrode 2a around the electrostatic chuck 6 so as to surround the electrostatic chuck 6. The uniformity of a plasma processing, such as, for example, etching on the surface of the semiconductor wafer W is improved by the focus ring 5. The side surfaces of the lower electrode 2a and the base 4 are surrounded by a cylindrical inner wall member 3a, which is formed of, for example, quartz. The inner wall member 3a constitutes the outer sidewall of the placing table 2.

For example, an annular coolant chamber 2b is formed within the lower electrode 2a. A coolant (e.g., cooling water) of a predetermined temperature is circulated and supplied to the coolant chamber 2b from a chiller unit (not illustrated) provided at the outside through pipes 2c and 2d. The temperature of the lower electrode 2a, the base 4, and the electrostatic chuck 6 is controlled by the coolant circulated inside the coolant chamber 2b, so that the semiconductor wafer W on the electrostatic chuck 6 is controlled to a predetermined temperature.

In addition, a heat transfer gas (e.g., He gas) is supplied from a heat transfer gas supply mechanism (not illustrated) to a gap between the upper surface 6b of the electrostatic chuck 6 and the rear surface of the semiconductor wafer W through a pipe 17.

A high frequency power source 12a is connected to the lower electrode 2a via a matcher 11a. In addition, a high frequency power source 12b is connected to the lower electrode 2a via a matcher 11b. The high frequency power source 12a supplies high frequency power, which has a predetermined frequency (e.g., 100 MHz) used in the generation of plasma, to the lower electrode 2a. In addition, the high frequency power source 12b supplies high frequency power having a predetermined frequency used in the attraction (bias) of ions, i.e., high frequency power having a lower frequency (e.g., 13 MHz) than the high frequency power source 12*a*, to the lower electrode 2*a*.

An exhaust path 86 is provided around the placing table 2 so as to surround the placing table 2. A baffle plate 72 having a plurality of through-holes is provided around the placing table 2 so as to surround the placing table 2 within the exhaust path 86. The baffle plate 72 is disposed in the exhaust path 86 at a position below the electrostatic chuck 6 and above the support beams 101. The exhaust path 86 communicates with an exhaust space 85 which is formed below the pedestal 100 in a space between the adjacent support beams 101.

The exhaust port 83 is formed in the bottom surface of the chamber 1 such that the center of the exhaust port 83 having a substantially circular shape is located on the Z-axis. An exhaust device 84 is connected to the exhaust port 83. The exhaust device 84 includes a vacuum pump (e.g., a turbo molecular pump), and may decompress the inside of the chamber 1 to a desired vacuum degree. In addition, the exhaust port 83 is provided with an automatic pressure control (APC) 80. The APC 80 includes a cover 81 and a support rod 82. The cover 81 is a substantially circular plate, and is disposed above the exhaust port 83 such that the center axis of the cover 81 coincides with the Z-axis. In addition, the cover 81 is disposed in substantially parallel with an opening plane of the exhaust port 83. The diameter of the cover 81 is greater than the diameter of an opening in the exhaust port 83.

The support rod 82 may control an exhaust conductance, which is formed by a gap between the cover 81 and the surface of the chamber 1 around the exhaust port 83 by controlling the height of the cover 81. Although FIG. 1 illustrates two support rods 82, three or more support rods 82 may be provided around the exhaust port 83 so as to surround the exhaust port 83. By controlling the height of the cover 81 by the support rods 82, the APC 80 may control the pressure inside the chamber 1 to a predetermined pressure range.

A space 102 is formed inside the pedestal 100 and the support beams 101. The space 102 communicates with an opening formed in the sidewall of the chamber 1. For example, a gas or power to be supplied to the placing table 2 is supplied to the placing table 2 through a pipe or wire, which passes through the space 102 inside the pedestal 100 and the support beams 101. In the present exemplary embodiment, the pedestal 100 is supported by three support beams 101. Although the pipe or wire, which supplies, for example, a gas or power to the placing table 2, is connected to an appliance outside the chamber 1 through one support beam 101 in the example of FIG. 1, the disclosed technology is not limited thereto. For example, the pipe or wire, which supplies, for example, a gas or power to the placing table 2, may be connected to an appliance outside the chamber 1 through any one of the three support beams 101.

A cooling device 18 is provided on the lower surface of the pedestal 100 in the space 102 inside the pedestal 100. A coolant chamber, through which a coolant of a predetermined temperature (e.g., cooling water) flows, is formed within the cooling device 18. The coolant chamber is connected to a pipe 18*a* and a pipe 18*b*. The coolant circulated and supplied to the coolant chamber may be, for example, air or brine other than the cooling water. As the coolant is circulated and supplied from a chiller unit (not illustrated), which is provided outside the substrate processing apparatus 10, to the coolant chamber in the cooling device 18 through the pipe 18*a* and the pipe 18*b*, the cooling device 18 may cool the lower surface of the pedestal 100.

A deposition trap part 20 is provided on the lower surface of the pedestal 100, which faces the exhaust port 83. In the present exemplary embodiment, the deposition trap part 20 is formed of, for example, a metal having high thermal conductivity, such as, for example, copper. The lower surface of the deposition trap part 20, which faces the exhaust port 83, is processed to a predetermined roughness. In the present exemplary embodiment, the surface of the deposition trap part 20, which faces the exhaust port 83, has a surface roughness (e.g., an arithmetic mean roughness Ra), for example, within a range from 6.3 µm to 25 µm. Specifically, the surface roughness obtained by a blast processing may be a value taken such that the surface area is wide, i.e., about 25 µm. The deposition trap part 20 is cooled by the cooling device 18 through the lower surface of the pedestal 100. In the example of FIG. 1, the deposition trap part 20 and the cooling device 18 are provided as separate members. However, in another example, the deposition trap part 20 and the cooling device 18 may be formed integrally with each other. Alternatively, a coolant chamber may be provided within the deposition trap part 20, and the pipe 18*a* and the pipe 18*b* may be connected to the coolant chamber in the deposition trap part 20, so that a coolant is circulated and supplied to the coolant chamber in the deposition trap part 20 through the pipe 18*a* and the pipe 18*b*. The deposition trap part 20 is an example of a collecting member.

Here, a gas exhausted through the exhaust path 86 and the exhaust space 85 includes particles of a reaction byproduct, which is called a deposit. Such a deposit is attached to the sidewall of the exhaust path 86 or the exhaust space 85, as well as the inside of the exhaust device 84 which is connected to the exhaust port 83, in an exhaust process. When the amount of the deposit attached to the exhaust device 84 is increased, the exhaust ability of the exhaust device 84 is deteriorated, which makes it difficult to maintain the inside of the chamber 1 at a predetermined pressure. Therefore, in order to remove the deposit attached inside the exhaust device 84, the exhaust device 84 needs to be regularly disassembled and washed. When the washing of the exhaust device 84 is performed, a process using the substrate processing apparatus 10 stops until the exchange or washing of the exhaust device 84 ends, which causes deterioration in the throughput of the process.

In order to avoid this, in the substrate processing apparatus 10 of the present exemplary embodiment, the deposition trap part 20 is provided inside the exhaust space 85. Thus, the deposit, which is included in the gas exhausted through the exhaust path 86 and the exhaust space 85, is attached to the deposition trap part 20. Therefore, the amount of the deposit attached inside the exhaust device 84 may be reduced. Thus, it is possible to suppress deterioration in the throughput of the process due to, for example, the washing of the exhaust device 84.

In addition, in the present exemplary embodiment, the deposition trap part 20 is cooled by the cooling device 18. Thus, a large amount of the deposit, which is included in a processing gas exhausted through the exhaust path 86 and the exhaust space 85, may be attached by the deposition trap part 20. Thus, the amount of the deposit attached inside the exhaust device 84 or to the inner sidewall of the chamber 1 may be further reduced.

In addition, in the present exemplary embodiment, the surface of the deposition trap part 20 which is exposed to the exhaust space 85 is processed to a predetermined roughness. Thus, a large amount of the deposit, which is included in the processing gas exhausted through the exhaust path 86 and the exhaust space 85, may be attached by the deposition trap part 20. Thus, the amount of the deposit attached inside the exhaust device 84 or to the inner sidewall of the chamber 1 may be further reduced.

In addition, in the present exemplary embodiment, a window 87 is formed in the sidewall of the chamber 1 below the pedestal 100. The window 87 is opened at the time of carry-in/out of the deposition trap part 20, Thus, the deposition trap part 20 attached with the deposit may be easily taken out from the inside of the chamber 1. Thus, the maintenance time required for the replacement of the deposition trap part 20 may be reduced.

In addition, an opening 74 is provided in the sidewall of the chamber 1 above the electrostatic chuck 6. The opening 74 is provided with a gate valve G for opening or closing the opening 74. In addition, deposition shields 76 and 77 are detachably provided on the inner sidewall of the chamber 1 and the outer sidewall of the placing table 2, respectively. The deposition shields 76 and 77 prevent the deposit from being attached to the inner sidewall of the chamber 1. A conductive member (GND block) 79, which is galvanically connected to a ground, is provided at the position of the deposition shield 76, which is approximately at the same height as the semiconductor wafer W attracted to and held on the electrostatic chuck 6. Abnormal discharge inside the chamber 1 is suppressed by the GND block 79.

An upper electrode 16 is provided above the lower electrode 2a to face the placing table 2. The lower electrode 2a and the upper electrode 16 are provided substantially in parallel with each other within the chamber 1. Hereinafter, a space between the semiconductor wafer W placed on the electrostatic chuck 6 and the lower surface of the upper electrode 16 is often referred to as a processing space S.

The upper electrode 16 is supported in an upper portion of the chamber 1 via an insulation member 45. In the present exemplary embodiment, the insulation member 45 is provided with a heater (not illustrated). Therefore, the insulation member 45 may be controlled to a temperature within a desired range during a processing of the semiconductor wafer W. Hereinafter, the heater provided within the insulation member 45 is referred to as a first heater. In the present exemplary embodiment, the substrate processing apparatus 10 is provided with a heater (not illustrated) at a position on the sidewall of the chamber 1, which is substantially higher than the position of the electrostatic chuck 6. Hereinafter, the heater provided on the sidewall of the chamber 1 is referred to as a second heater.

The upper electrode 16 includes a ceiling plate support portion 16a and an upper ceiling plate 16b. The ceiling plate support portion 16a is formed of, for example, aluminum of which the surface is subjected to anodizing treatment, and detachably supports the upper ceiling plate 16b therebelow. The upper ceiling plate 16b is formed of, for example, a silicon-containing material (e.g., quartz).

A gas diffusion chamber 16c is provided inside the ceiling plate support portion 16a. The gas diffusion chamber 16c may have a substantially cylindrical shape, and the center axis thereof may coincide with the Z-axis. A plurality of gas distribution holes 16e are formed in the bottom portion of the ceiling plate support portion 16a so as to be located below the gas diffusion chamber 16c. The plurality of gas distribution holes 16e are formed below the gas diffusion chamber 16c at substantially equal intervals concentrically around the Z-axis.

A plurality of gas distribution holes 16f are provided in the upper ceiling plate 16b so as to penetrate the upper ceiling plate 16b in a thickness direction. The plurality of gas distribution holes 16f are formed in the upper ceiling plate 16b at substantially equal intervals concentrically around the Z-axis. Each gas distribution hole 16f communicates with one of the gas distribution holes 16e. A processing gas supplied to the gas diffusion chamber 16c is diffused in a shower from and supplied into the chamber 1 through the plurality of gas distribution holes 16e and 16f. In addition, the plurality of gas distribution holes 16e and 16f are arranged at substantially equal intervals concentrically around the Z-axis. Therefore, the processing gas, which has been supplied into the chamber 1 through the plurality of gas distribution holes 16e and 16f, is supplied into the processing space S at a substantially uniform flow rate in a peripheral direction about the Z-axis.

For example, the ceiling plate support portion 16a may be provided with a temperature adjustment mechanism such as, for example, a heater (not illustrated) or a pipe (not illustrated) for circulating a coolant, so that the upper electrode 16 may be controlled to a temperature within a desired range during the processing of the semiconductor wafer W.

The ceiling plate support portion 16a of the upper electrode 16 is provided with a gas introduction hole 16g for introducing the processing gas into the gas diffusion chamber 16c. The gas introduction hole 16g may be disposed such that the Z-axis passes through the center of the gas introduction hole 16g. One end of a pipe 15b is connected to the gas introduction hole 16g. The other end of the pipe 15b is connected to a gas source 15, which supplies the processing gas to be used in the processing of the semiconductor wafer W through a valve V and a mass flow controller (MFC) 15a. The processing gas supplied from the gas source 15 is supplied to the gas diffusion chamber 16c through the pipe 15b, thereby being diffused in a shower form and supplied into the chamber 1 through the gas distribution holes 16e and 16f.

A variable DC power source 42, which outputs a negative DC voltage, is electrically connected to the upper electrode 16 through a low pass filter (LPF) 40 and a switch 41. The switch 41 controls the application and cutoff of a DC voltage from the variable DC power source 42 to the upper electrode 16. For example, high frequency power is applied from the high frequency power source 12a and the high frequency power source 12b to the lower electrode 2a. Thus, when plasma is generated in the processing space S within the chamber 1, the switch 41 is turned on as needed so that a negative DC voltage of a predetermined magnitude is applied to the upper electrode 16.

In addition, a ring magnet 90 is disposed concentrically around the chamber 1. The ring magnet 90 forms a magnetic field in the processing space S between the upper electrode 16 and the placing table 2. The ring magnet 90 is rotatably held by a rotating mechanism (not illustrated).

An operation of the substrate processing apparatus 10 configured as described above is generally controlled by a controller 60. The controller 60 includes a process controller 61, which includes a central processing unit (CPU) and controls respective components of the substrate processing apparatus 10, a user interface 62, and a storage unit 63.

The user interface 62 includes, for example, a keyboard which is used by an operator to input, for example, a command for manipulating the substrate processing apparatus 10, or a display which visibly displays an operating state of the substrate processing apparatus 10.

The storage unit 63 stores, for example, a control program (software) for allowing the process controller 61 to implement various processings executed in the substrate processing apparatus 10, or a recipe in which, for example, processing condition data is stored. The process controller 61 reads the control program stored in the storage unit 63, and operates based on the read control program. Then, the process controller 61 reads, for example, the recipe from the storage unit 63 in response to, for example, an instruction received via the user interface 62, and controls the substrate processing apparatus 10 based on, for example, the read recipe. Thus, a desired processing is performed by the substrate processing apparatus 10. In addition, the process controller 61 may read and execute, for example, a control program or a recipe stored in, for example, a computer-readable recording medium, from the recording medium. The computer-readable recording medium is, for example, a hard disc, a digital versatile disc (DVD), a flexible disc, or a semiconductor memory. In addition, the process controller 61 may acquire, for example, a control program or a recipe stored in a memory of another device, from the other device through, for example, a communication line, and may execute the acquired control program or the recipe.

In a case where a processing is performed using plasma on the semiconductor wafer W in the substrate processing apparatus 10, the controller 60 performs the following control on the substrate processing apparatus 10. First, the controller 60 controls the valve V and the MFC 15a in the state where the semiconductor wafer W is placed on the electrostatic chuck 6 to supply a processing gas into the gas diffusion chamber 16c at a predetermined flow rate. The processing gas supplied into the gas diffusion chamber 16c is diffused in a shower form and supplied into the chamber 1 through the gas distribution holes 16e and 16f. In addition, the controller 60 controls the APC 80 by operating the exhaust device 84 to control an exhaust conductance, thereby controlling the inside of the chamber 1 to a predetermined pressure.

In addition, the controller 60 controls the high frequency power source 12a and the high frequency power source 12b to generate predetermined high frequency power, respectively, thereby applying the high frequency power to the lower electrode 2a. Further the controller 60 controls the switch 41 to be turned on, thereby applying a predetermined DC voltage to the upper electrode 16. Thus, plasma of the processing gas is generated in the processing space S between the semiconductor wafer W on the electrostatic chuck 6 and the upper electrode 16. Then, a predetermined processing (e.g., etching) is performed on the semiconductor wafer W placed on the electrostatic chuck 6 by ions or radicals included in the plasma generated in the processing space S.

[Positional Relationship between Chamber 1 and Placing Table 2]

Figure 2:
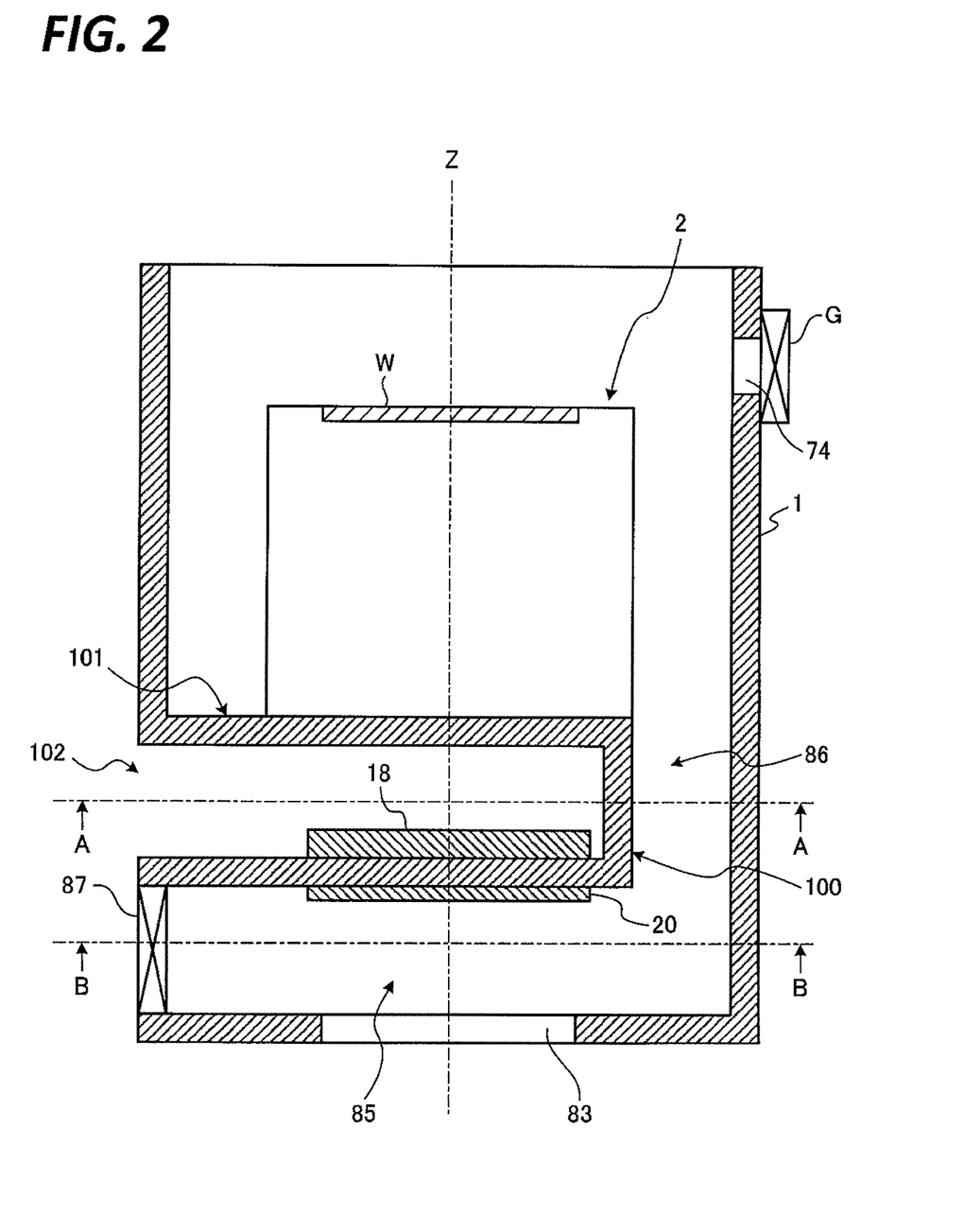
FIG. 2 is a view schematically illustrating an example of a positional relationship between a chamber and a placing table.
Figure 3:
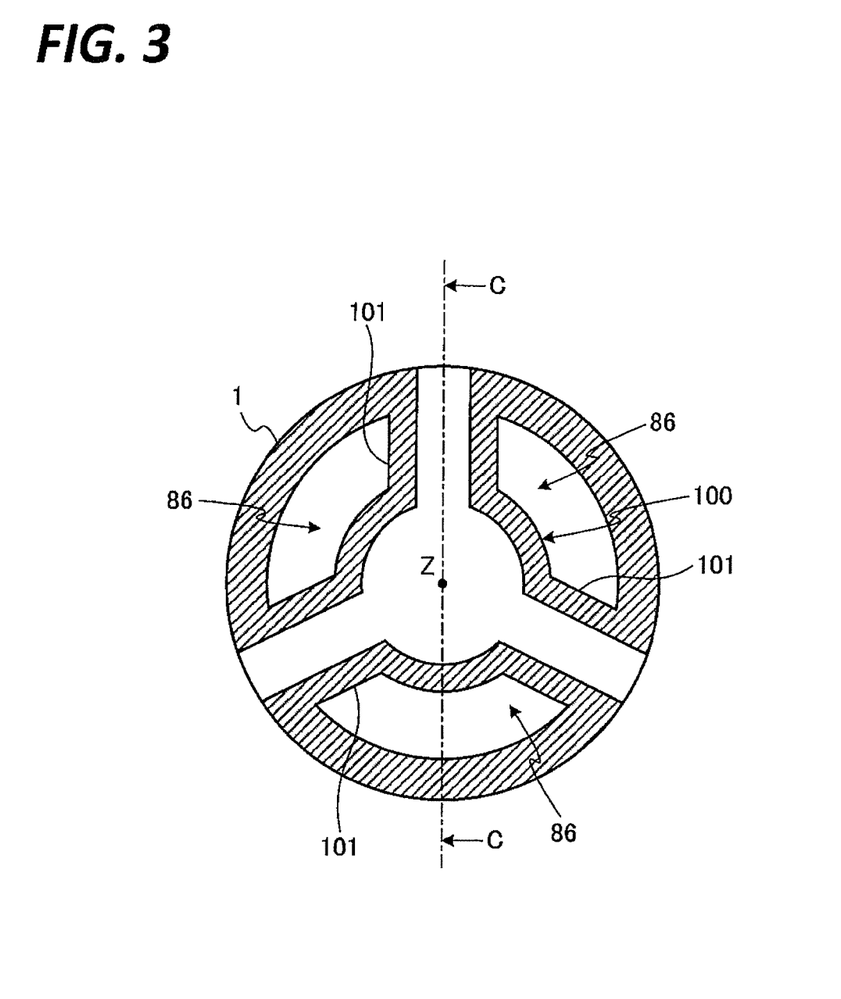
FIG. 3 is a view schematically illustrating an example of A-A cross-section of the chamber illustrated in FIG. 2.
Figure 4:
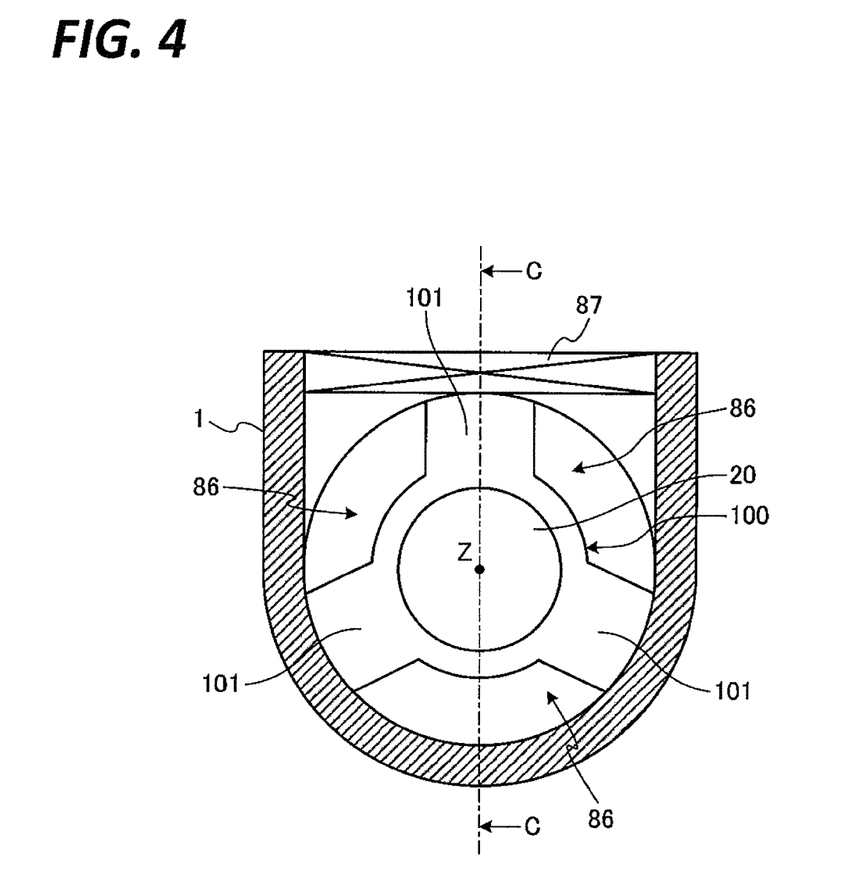
FIG. 4 is a view schematically illustrating an example of B-B cross-section of the chamber illustrated in FIG. 2.

FIG. 2 is a view schematically illustrating an example of a positional relationship between the chamber 1 and the placing table 2. FIG. 3 is a view schematically illustrating an example of A-A cross-section of the chamber 1 illustrated in FIG. 2. FIG. 4 is a view schematically illustrating an example of B-B cross-section of the chamber 1 illustrated in FIG. 2. The C-C cross-section of the chamber 1 illustrated in FIGS. 3 and 4 corresponds to the cross-sectional view illustrated in FIG. 2.

In the present exemplary embodiment, the chamber 1, the placing table 2, and the exhaust port 83 are arranged, for example, as illustrated in FIG. 2, such that the center axis of the semiconductor wafer W placed on the placing table 2 coincides with the center axis of the inner sidewall of the chamber 1, the center axis of the outer sidewall of the placing table 2, and the center axis of the exhaust port 83. In addition, the placing table 2 is supported by the pedestal 100 from the lower side thereof, and the deposition trap part 20 is disposed on the lower surface of the pedestal 100. In the present exemplary embodiment, the deposition trap part 20 is a substantially circular plate-like body. The deposition trap part 20 may be disposed at the position where the Z-axis passes through the center of the deposition trap part 20. The shape of the deposition trap part 20 is not limited to the substantially circular shape, and may be a polygonal shape. In addition, a plurality of deposition trap parts 20 may be disposed on the lower surface of the pedestal 100. In this case, each deposition trap part 20 may be disposed such that the Z-axis passes through the center of the arrangement of the deposition trap parts 20.

In addition, for example, as illustrated in FIGS. 3 and 4, the pedestal 100 is supported by the support beams 101 which extend from the inner sidewall of the chamber 1 in the direction approaching the Z-axis. In the present exemplary embodiment, the support beams 101 extend from the inner sidewall of the chamber 1 in the direction perpendicular to the Z-axis. For example, as illustrated in FIGS. 3 and 4, the support beams 101 are arranged axially symmetrical relative to the Z-axis. That is, the line, which passes through the center of the arrangement of the support beams 101, coincides with the Z-axis. In addition, in the present exemplary embodiment, for example, as illustrated in FIGS. 3 and 4, the pedestal 100 is supported by three support beams 101. Because the three support beams 101 are arranged axially symmetrical relative to the Z-axis, the two adjacent support beams 101 formed an angle of 120 degrees about the Z-axis when viewed in the direction along the Z-axis.

The exhaust path 86 formed around the placing table 2 communicates with the exhaust space 85 below the pedestal 100 through a space between the two adjacent support beams 101. Because the support beams 101 are arranged axisymmetrically with respect to the Z-axis, the space between the two adjacent support beams 101 is also formed axisymmetrically with respect to the Z-axis, for example, as illustrated in FIGS. 3 and 4.

In the present exemplary embodiment, a processing gas is supplied into the chamber 1 through the gas distribution holes 16e and 16f, which are formed in the upper electrode 16 at substantially equal intervals concentrically around the Z-axis, which passes through the center of the semiconductor wafer W placed on the placing table 2. In addition, the center axis of the substantially cylindrical space defined by the inner sidewall of the chamber 1, the center axis of the placing table 2, the center axis of the exhaust port 83, and the line that passes through the center of the arrangement of the support beams 101 coincide with the Z-axis. In addition, the exhaust path 86 formed around the placing table 2 communicates with the exhaust space 85 through the space which is formed axisymmetrically with respect to the Z-axis between the two adjacent support beams 101. Therefore, the flow of the gas supplied from the upper electrode 16 and exhausted from the exhaust port 83 is axisymmetric with respect to the Z-axis, which passes through the center of the semiconductor wafer W placed on the placing table 2. Thus, in the peripheral direction of the semiconductor wafer W placed on the placing table 2, deviation of the flow of the gas in the chamber 1 may be reduced, which may improve the in-plane uniformity of a processing on the semiconductor wafer W.

[Relationship Between Amount of Attachment of Deposition and Temperature]

Figure 5:
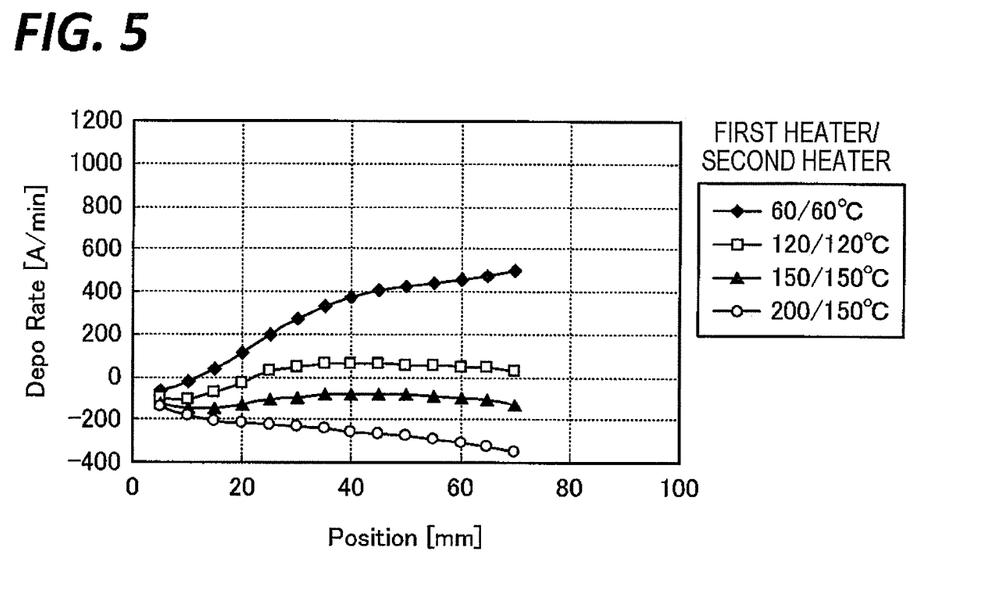
FIG. 5 is a view illustrating an example of an experimental result of a relationship between an attachment amount of a deposit and a temperature on a lower surface of an insulation member.

Here, a relationship between the attachment amount of a deposit and a temperature will be described. FIG. 5 is a view illustrating an example of an experimental result of a relationship between the attachment amount of a deposit and a temperature on the lower surface of the insulation member 45. In the substrate processing apparatus 10 of the present exemplary embodiment, the first heater (not illustrated) is provided inside the insulation member 45, and the second heater (not illustrated) is provided at a position on the sidewall of the chamber 1 which is substantially higher than the position of the electrostatic chuck 6. In addition, in FIGS. 5 to 8, for example, "60/60° C." indicates "the temperature of the first heater/the temperature of the second heater."

In addition, in FIG. 5, the horizontal axis represents a position in the case of moving in the direction approaching the Z-axis along the lower surface of the insulation member 45 under the condition that the outermost circumference of the lower surface of the insulation member 45 facing the processing space S is a reference (0 mm). In addition, the vertical axis in FIG. 5 represents a thickness of a deposit attached to the lower surface of the insulation member 45 per unit time.

Referring to the experimental result illustrated in FIG. 5, when the temperatures of the first heater and the second heater are raised, the deposit attached to the lower surface of the insulation member 45 tends to be decreased. Meanwhile, referring to the experimental result illustrated in FIG. 5, when the temperatures of the first heater and the second heater are lowered, the deposit attached to the lower surface of the insulation member 45 tends to be increased.

Figure 6:
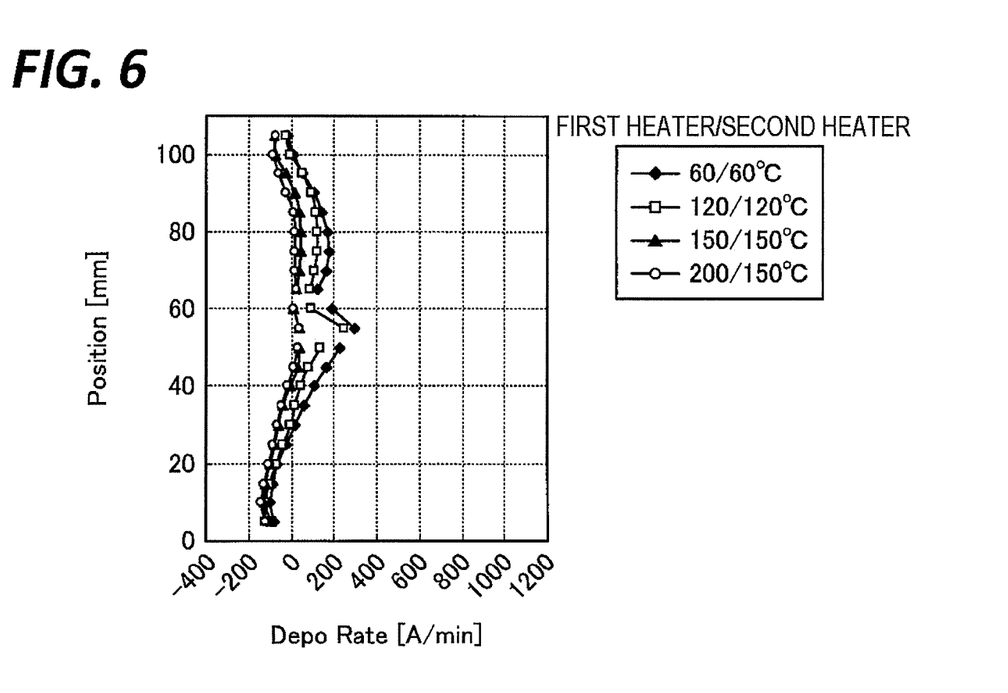
FIG. 6 is a view illustrating an example of an experimental result of a relationship between an attachment amount of a deposit and a temperature on a deposition shield.

FIG. 6 is a view illustrating an example of an experimental result of a relationship between the attachment amount of a deposit and a temperature on the deposition shield 76. In FIG. 6, the vertical axis represents a position on the deposition shield 76 in the case of moving upward along the surface of the deposition shield 76 under the condition that the position where the baffle plate 72 is located on the surface of the deposition shield 76 is a reference (0 mm). In addition, the horizontal axis in FIG. 6 represents a thickness of the deposit attached to the surface of the deposition shield 76 at the processing space S side per unit time.

Referring to the experimental result illustrated in FIG. 6, when the temperatures of the first heater and the second heater are raised, the deposit attached to the surface of the deposition shield 76 at the processing space S side tends to be decreased. Meanwhile, referring to the experimental result illustrated in FIG. 6, when the temperatures of the first heater and the second heater are lowered, the deposit attached to the surface of the deposition shield 76 at the processing space S side tends to be increased.

The first heater is provided in the insulation member 45 and the second heater is provided on the inner sidewall of the chamber 1. Therefore, when the temperatures of the first heater and the second heater are raised, the temperatures of the insulation member 45 and the deposition shield 76 are raised. When the temperatures of the insulation member 45 and the deposition shield 76 are high, it seems that the amount of the deposit attached to the insulation member 45 or the deposition shield 76 is small because energy loss is small even though particles included in the gas in the processing space S collide with the insulation member 45 or the deposition shield 76. Therefore, for example, as illustrated in FIGS. 5 and 6, it seems that the thickness of the deposit attached to the insulation member 45 or the deposition shield 76 is reduced as the temperatures of the insulation member 45 and the deposition shield 76 are raised.

Figure 7:
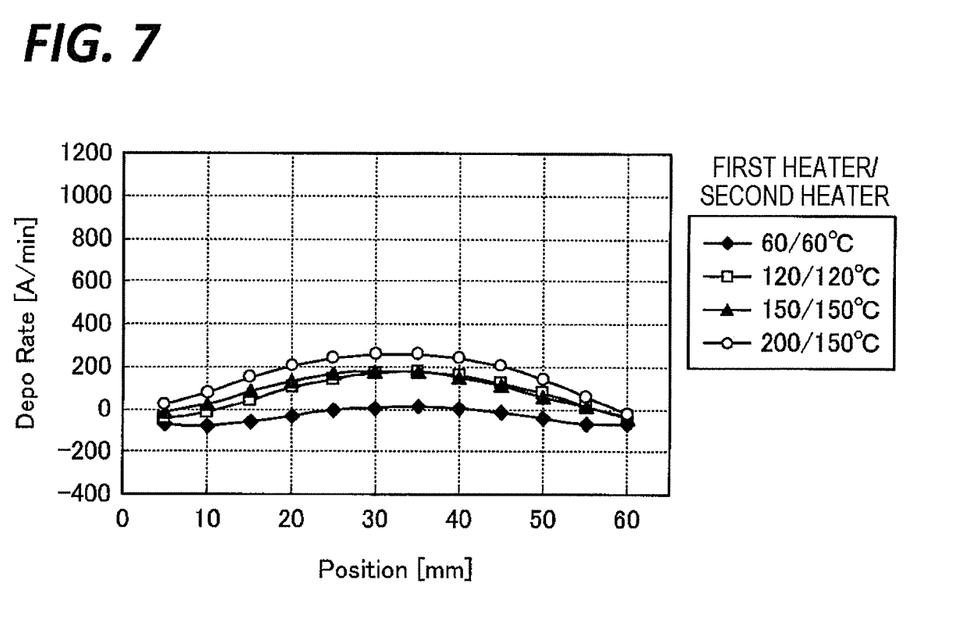
FIG. 7 is a view illustrating an example of an experimental result of a relationship between an attachment amount of a deposit and a temperature on a baffle plate.

FIG. 7 is a view illustrating an example of an experimental result of a relationship between the attachment amount a deposit and a temperature on the baffle plate 72. In FIG. 7, the horizontal axis represents a position on the upper surface of the baffle plate 72 in the case of moving in the direction approaching the Z-axis along the upper surface of the baffle plate 72 under the condition that the position of the outermost circumference of the baffle plate 72 on the upper surface of the baffle plate 72 is a reference (0 mm). In addition, the vertical axis in FIG. 7 illustrates a thickness of the deposit attached to the upper surface of the baffle plate 72 per unit time.

Referring to the experimental result illustrated in FIG. 7, when the temperatures of the first heater and the second heater are raised, the deposit attached to the upper surface of the baffle plate 72 tends to be increased. Meanwhile, referring to the experimental result illustrated in FIG. 7, when the temperatures of the first heater and the second heater are lowered, the deposit attached to the upper surface of the baffle plate 72 tends to be decreased.

Figure 8:
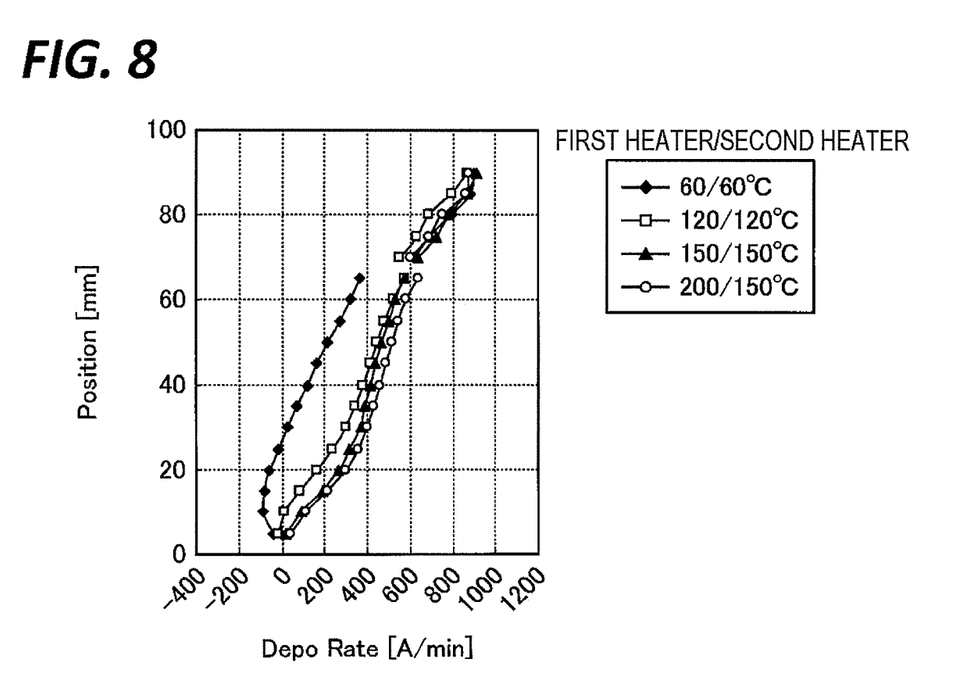
FIG. 8 is a view illustrating an example of an experimental result of a relationship between an attachment amount of a deposit and a temperature on a deposition shield provided on an outer sidewall of the placing table.

FIG. 8 is a view illustrating an example of an experimental result of a relationship between the attachment amount of a deposit and a temperature on the deposition shield 77 provided on the outer sidewall of the placing table 2. In FIG. 8, the vertical axis represents a position on the deposition shield 77 in the case of moving upward along the surface of the deposition shield 77 under the condition that the position where the baffle plate 72 is located on the surface of the deposition shield 77 at the exhaust path 86 side, at which is a reference (0 mm). In addition, the horizontal axis in FIG. 8 represents a thickness of the deposit attached to the surface of the deposition shield 77 at the exhaust path 86 side per unit time.

Referring to the experimental result illustrated in FIG. 8, when the temperatures of the first heater and the second heater are raised, the deposit attached to the surface of the deposition shield 77 at the exhaust side 86 side tends to be increased. Meanwhile, referring to the experimental result illustrated in FIG. 8, when the temperatures of the first heater and the second heater are lowered, the deposit attached to the surface of the deposition shield 77 at the exhaust path 86 side tends to be decreased.

Because the first heater or the second heater is not provided on the baffle plate 72 and the deposition shield 77, the temperatures of the baffle plate 72 and the deposition shield 77 are not raised even though the temperature of the first heater or the second heater is raised. When the temperatures of the first heater and the second heater are raised, the temperatures of the insulation member 45 and the deposition shield 76 are raised, so that the amount of the deposit attached to the insulation member 45 or the deposition shield 76 is decreased. However, because the amount of particles included in the gas inside the processing space S is not changed, it seems that a large amount of the deposit is attached by a member having a lower temperature than the temperatures of the insulation member 45 and the deposition shield 76. Therefore, as illustrated in FIGS. 7 and 8, it seems that the thickness of the deposit attached to the baffle plate 72 and the deposition shield 77 is increased as the temperatures of the insulation member 45 and the deposition shield 76 are raised.

Meanwhile, when the temperatures of the first heater and the second heater are lowered, the temperatures of the insulation member 45 and the deposition shield 76 are lowered, so that the amount of the deposit attached to the insulation member 45 or the deposition shield 76 is increased. Therefore, for example, as illustrated in FIGS. 7 and 8, it seems that the thickness of the deposit attached to the baffle plate 72 and the deposition shield 77 is relatively reduced.

Referring to the experimental results illustrated in FIGS. 5 to 8, it can be appreciated that a larger amount of the deposit is attached to a member having a relatively low temperature among members, which are exposed to the gas including particles that generate a deposit. In addition, it can be appreciated that the amount of the deposit attached to the other members may be reduced because a larger amount of the deposit is attached to a predetermined member.

Accordingly, in the present exemplary embodiment, the deposition trap part 20 is located in the exhaust space 85 in which the gas is distributed, and the deposition trap part 20 is cooled by the cooling device 18. Thus, a larger amount of particles than that included in the gas exhausted through the exhaust space 85 is attached to the surface of the deposition trap part 20, thereby forming a deposit. As a result, the amount of the deposit attached to the inner sidewall of the chamber 1 or inside the exhaust device 84 may be reduced.

One embodiment of the substrate processing apparatus 10 has been described above. According to the substrate processing apparatus 10 of the present exemplary embodiment, the amount of the deposit attached, for example, inside the exhaust device 84 may be reduced by attaching particles included in the exhaust gas to the deposition trap part 20. Thus, the frequency with which the exhaust device 84 is disassembled and washed may be reduced, which may improve the throughput of a process using the substrate processing apparatus 10.

[Others]

The disclosed technology is not limited to the above embodiment, and numerous alterations are possible within the scope of the subject matter.

Figure 9:
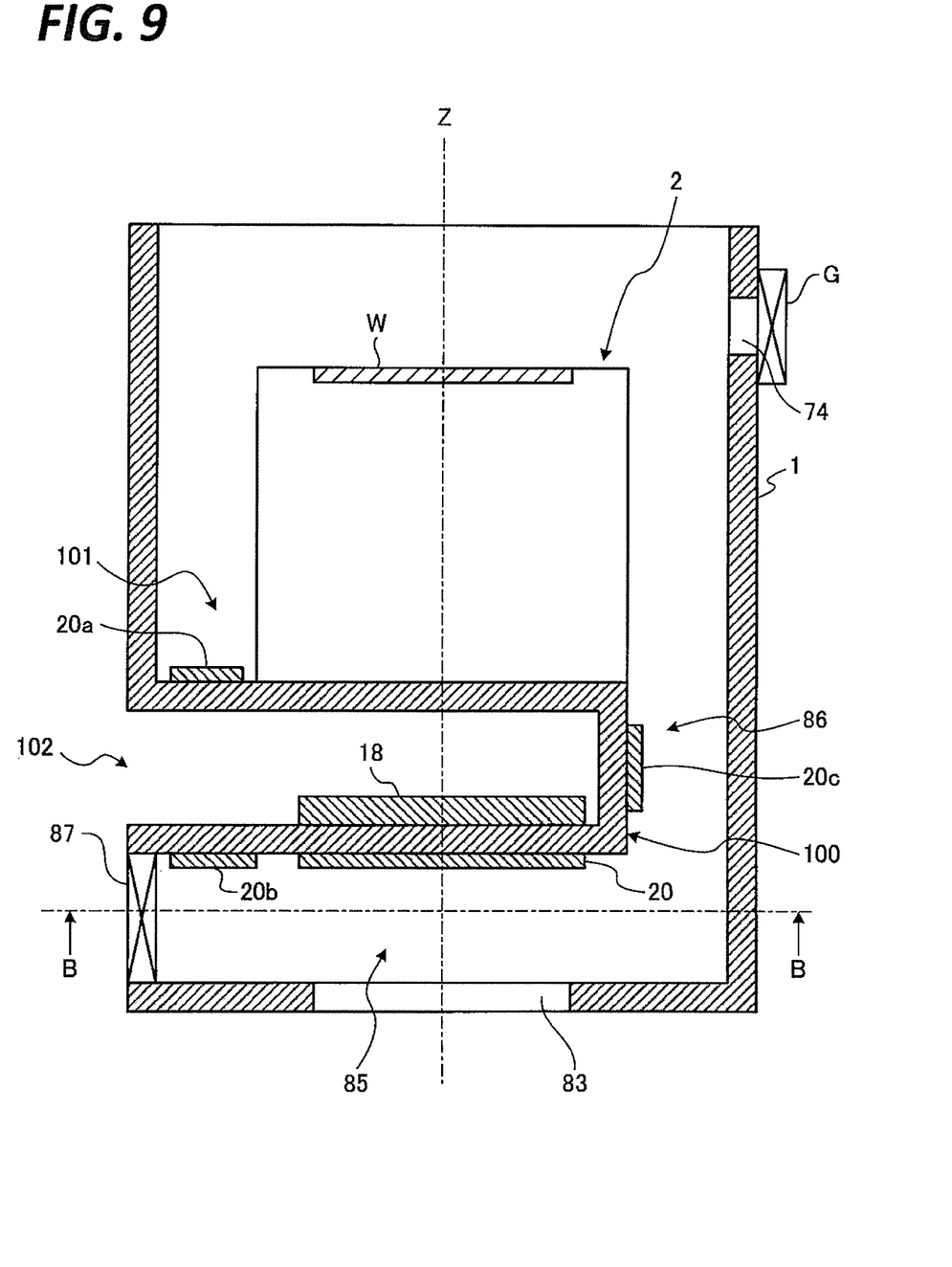
FIG. 9 is a schematic view illustrating another example of the arrangement of a deposition trap part.
Figure 10:
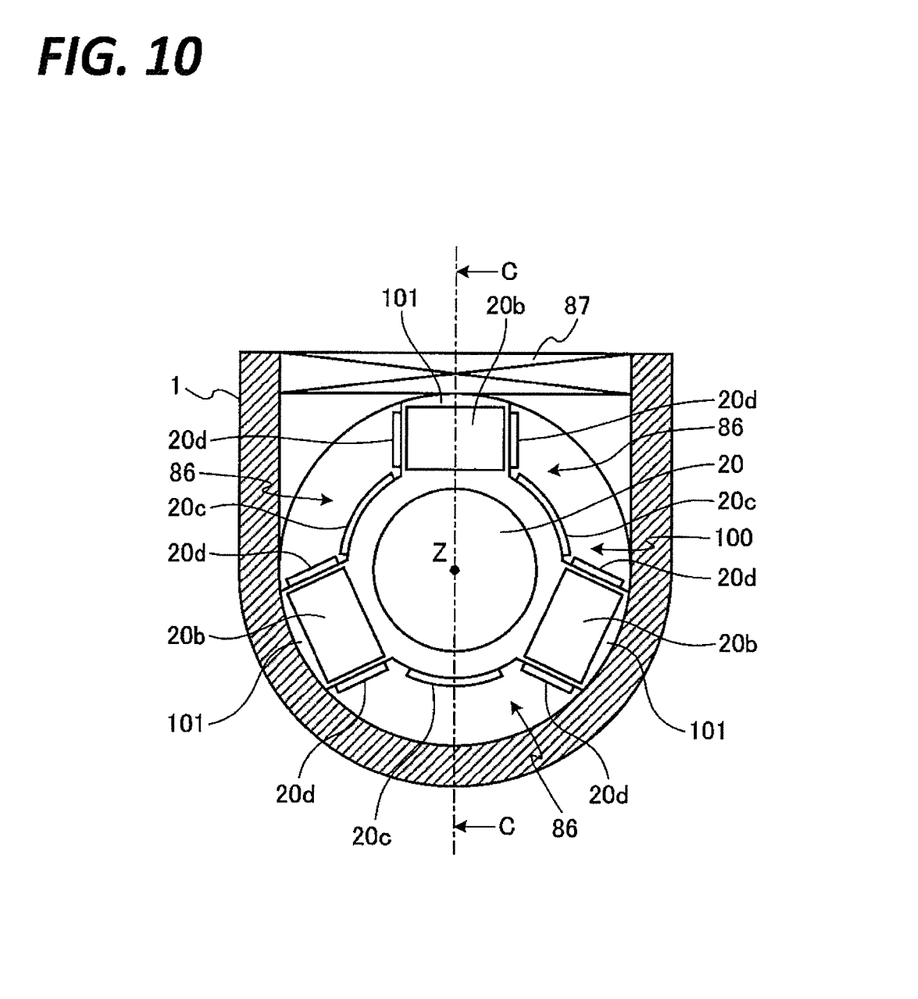
FIG. 10 is a view schematically illustrating an example of B-B cross-section of a chamber illustrated in FIG. 9.

For example, in the above embodiment, although the deposition trap part 20 is provided on the lower surface of the support beam 101, faces the exhaust port 83, above the exhaust port 83, the disclosed technology is not limited thereto. FIGS. 9 and 10 are schematic views illustrating another example of the arrangement of the deposition trap part 20. For example, as illustrated in FIG. 9, a deposition trap part 20*a* may be additionally disposed on the upper surface of each support beam 101. In addition, for example, as illustrated in FIGS. 9 and 10, a deposition trap part 20*b* may be additionally placed on the lower surface of each support beam 101. In addition, for example, as illustrated in FIGS. 9 and 10, a deposition trap part 20*c* may be additionally placed on the side surface of the pedestal 100. In addition, as illustrated in FIG. 10, a deposition trap part 20*d* may be additionally placed on the side surface of each support beam 101.

In the example illustrated in FIGS. 9 and 10, each of the deposition trap parts 20*a* to 20*d* may be disposed such that the Z-axis passes through the center of the arrangement of the deposition trap parts 20*a* to 20*d*. In addition, in the example illustrated in FIGS. 9 and 10, although the cooling device 18 is disposed on the bottom surface inside the pedestal 100, the cooling device 18 may be disposed at each of positions inside the pedestal 100 or the support beam 101, which corresponds to the positions of the deposition trap parts 20*a* to 20*d*.

Figure 11:
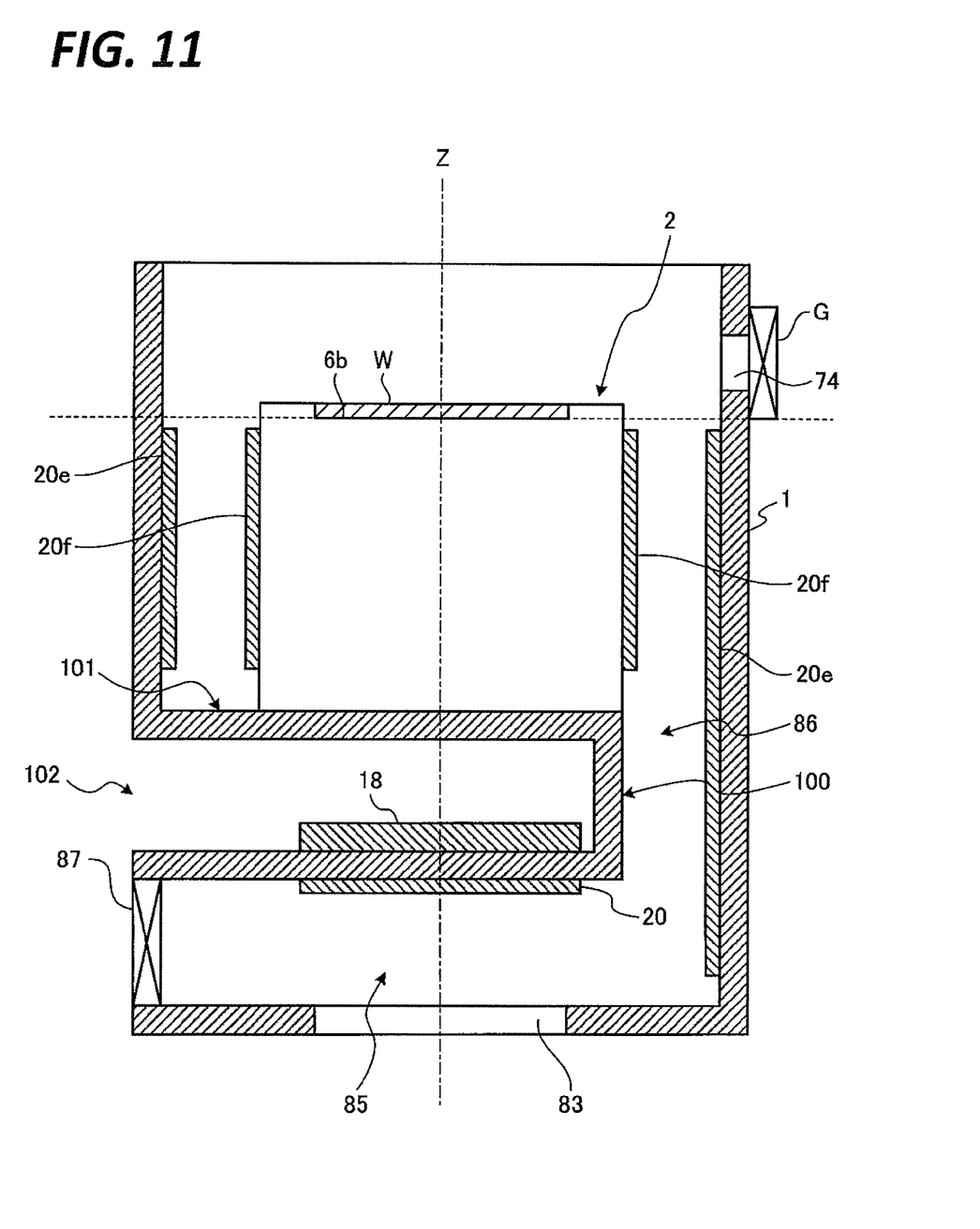
FIG. 11 is a schematic view illustrating a still another example of the arrangement of the deposition trap part.

In addition, the deposition trap part 20 may be additionally placed on a member excluding the pedestal 100 or the support beams 101. FIG. 11 is a schematic view illustrating a further example of the arrangement of the deposition trap part 20. For example, as illustrated in FIG. 11, a deposition trap part 20*e* may be additionally placed on the area of the inner sidewall of the chamber 1 below the upper surface 6*b* of the electrostatic chuck 6 on which the semiconductor wafer W is placed. In addition, for example, as illustrated in FIG. 11, a deposition trap part 20*f* may be additionally placed on the area of the outer sidewall of the placing table 2 below the upper surface 6*b* of the electrostatic chuck 6 on which the semiconductor wafer W is placed.

In addition, in the substrate processing apparatus 10 illustrated in the above embodiment, although the center axis of the substantially cylindrical space defined by the inner sidewall of the chamber 1, the center axis of the placing table 2, the center axis of the exhaust port 83, and the line that passes through the center of the arrangement of the support beams 101 coincide with the Z-axis, the disclosed technology is not limited thereto. For example, in the substrate processing apparatus 10 of another example, at least one or all of the center axis of the substantially cylindrical space defined by the inner sidewall of the chamber 1, the center axis of the placing table 2, the center axis of the exhaust port 83, and the line that passes through the center of the arrangement of the support beams 101 may not coincide with the Z-axis. Even in the substrate processing apparatus 10, when the deposition trap part 20 is located in the exhaust space 85 in which the gas is distributed and the deposition trap part 20 is cooled by the cooling device 18, a greater amount of particles than that included in the gas exhausted through the exhaust space 85 may be attached to the deposition trap part 20, which may reduce the amount of the deposit attached to the inner sidewall of the chamber 1 or inside the exhaust device 84.

In addition, in the above exemplary embodiment, although the deposition trap part 20 is cooled by the cooling device 18, the disclosed technology is not limited thereto. For example, by applying a predetermined DC voltage to the deposition trap part 20, the surface of the deposition trap part 20 may be charged with charges having a predetermined polarity so that particles included in the gas may be attracted by the deposition trap part 20 by an electrostatic force generated by the charges on the charged surface. In addition, cooling and charging of the deposition trap part 20 may be implemented in combination with each other. Thus, particles included in the gas inside the chamber 1 may be more effectively attached to the deposition trap part 20, which may reduce the amount of the deposit attached to other members.

In addition, in the above embodiment, although a capacitively coupled parallel plate plasma etching apparatus has been described as the substrate processing apparatus 10 by way of example, the disclosed technology is not limited thereto. The disclosed technology may also be applied to an etching apparatus using another method, such as, for example, inductively coupled plasma (ICP), so long as it performs a predetermined processing on the semiconductor wafer W using plasma. In addition, the disclosed technology may also be applied to an apparatus for performing, for example, film forming or modification, excluding an etching apparatus, so long as it performs a predetermined processing on the semiconductor wafer W using a gas.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate processing apparatus comprising:
a chamber;
a placing table provided inside the chamber and configured to place a processing target substrate thereon;
a pedestal configured to support the placing table from a lower side of the placing table;
an exhaust port disposed below the pedestal; and
a deposit collector provided on a bottom surface of a lower portion of the pedestal that is perpendicular to a center axis of an inner sidewall of the chamber to face the exhaust port, and configured to collect a deposit in the chamber,
wherein the chamber has a substantially cylindrical inner sidewall,
the pedestal includes a sidewall that extends vertically to face the cylindrical inner sidewall of the chamber, a plurality of upper support beams connected to an upper portion of the sidewall of the pedestal to form an upper portion of the pedestal, and a plurality of lower support beams connected to a lower portion of the sidewall of the pedestal to form the lower portion of the pedestal,
each of the plurality of upper support beams and at least two of the plurality of lower support beams extend from sidewall of the chamber in a direction approaching the center axis of the inner sidewall of the chamber,
wherein a space is formed inside the pedestal the sidewall, the plurality of upper support beams and the plurality of lower support beams of the pedestal, and
a cooler is provided in the space and on a top surface of the lower portion of the pedestal, corresponding to the deposit collector that is provided on the bottom surface of the lower portion of the pedestal in order to cool the deposit collector through the bottom surface of the lower portion of the pedestal.

2. The substrate processing apparatus of claim 1, wherein another deposit collector is additionally placed on at least one of a side surface of the pedestal, a top surface of each of the plurality of upper support beams, a side surface of the upper or lower support beams, and a bottom surface of each of the plurality of lower support beams.

3. The substrate processing apparatus of claim 1, wherein the placing table has a substantially cylindrical outer sidewall,
wherein the exhaust port has a substantially cylindrical shape,
the chamber, the placing table, and the exhaust port are arranged such that a center axis of the processing target substrate placed on the placing table coincides with the center axis of the inner sidewall of the chamber, a center axis of an outer sidewall of the placing table, and a center axis of the exhaust port, and
the plurality of upper support beams and the plurality of lower support beams are arranged such that the center axis of the processing target substrate placed on the placing table passes through each of a center of arrangement of the plurality of upper support beams and a center of arrangement of the plurality of lower support beams.

4. The substrate processing apparatus of claim 1, wherein a sidewall of the chamber below the pedestal is provided with a window that is opened at the time of carry-in/out of the deposit collector.

5. The substrate processing apparatus of claim 1, wherein the cooler cools the bottom surface of the lower portion of the pedestal using any one of water, air, and brine as a coolant.

6. The substrate processing apparatus of claim 1, wherein another deposit collector is additionally arranged at each of a position below a placement surface of the placing table, on an inner sidewall of the chamber and on an outer sidewall of the placing table.

7. The substrate processing apparatus of claim 1, wherein the deposit collector has a surface roughness within a range from 6.3 µm to 25 µm.

8. The substrate processing apparatus of claim 1, wherein the deposit collector is formed of a metal.

9. The substrate processing apparatus of claim 1, wherein a predetermined DC voltage is applied to the deposit collector.

10. The substrate processing apparatus of claim 1, wherein an exhaust space is interposed between the deposit collector and the exhaust port such that an exhaust path that is provided around the placing table communicates with the exhaust space.

11. The substrate processing apparatus of claim 10, wherein the deposit collector is configured to collect the deposit contained in a gas exhausted through the exhaust path and the exhaust space in the chamber.

12. The substrate processing apparatus of claim 1, wherein an exhaust path is provided around the placing table, and
the exhaust path is provided between two adjacent upper support beams of the plurality of upper support beams and two adjacent lower support beams of the plurality of lower support beams when viewed in a transversal cross section.

* * * * *